United States Patent
Okamoto et al.

(10) Patent No.: US 11,508,862 B2
(45) Date of Patent: Nov. 22, 2022

(54) THICK-FILM CONDUCTIVE PASTE, AND THEIR USE IN THE MANUFACTURE OF SOLAR CELLS

(71) Applicant: Changzhou Fusion New Material Co., Ltd., Jiangsu (CN)

(72) Inventors: Kuninori Okamoto, Jiangsu (CN); Haidong Liu, Jiangsu (CN); Yichao Ren, Jiangsu (CN); Changjun Xiong, Jiangsu (CN); Zhikai Xiong, Jiangsu (CN); Ansong Jiang, Jiangsu (CN); Li Wan, Jiangsu (CN); Tingting Mu, Jiangsu (CN)

(73) Assignee: Changzhou Fusion New Material Co., Ltd., Jiangsu (CN)

(*) Notice: Subject to any disclaimer, the term of this patent is extended or adjusted under 35 U.S.C. 154(b) by 71 days.

(21) Appl. No.: 16/969,109

(22) PCT Filed: Mar. 25, 2020

(86) PCT No.: PCT/CN2020/080999
§ 371 (c)(1),
(2) Date: Aug. 11, 2020

(87) PCT Pub. No.: WO2020/238367
PCT Pub. Date: Dec. 3, 2020

(65) Prior Publication Data
US 2021/0057596 A1 Feb. 25, 2021

(30) Foreign Application Priority Data

May 29, 2019 (WO) ............... PCT/CN2019/088954
Jun. 25, 2019 (WO) ............... PCT/CN2019/092654

(51) Int. Cl.
*H01L 31/05* (2014.01)
*H01L 31/054* (2014.01)
*H01L 31/18* (2006.01)

(52) U.S. Cl.
CPC ........ *H01L 31/0512* (2013.01); *H01L 31/054* (2014.12); *H01L 31/0516* (2013.01); *H01L 31/186* (2013.01)

(58) Field of Classification Search
CPC .......... H01L 31/02168; H01L 31/0224; H01L 31/022425; H01L 31/0512; H01L 31/0516; H01L 31/054; H01L 31/186; C03C 12/00
See application file for complete search history.

(56) References Cited

U.S. PATENT DOCUMENTS

2015/0027524 A1* 1/2015 Seyedmohammadi .. H01B 1/16
  136/256
2016/0284889 A1 9/2016 Akimoto et al.
2016/0315208 A1* 10/2016 Yeh ........................... C03C 8/08

FOREIGN PATENT DOCUMENTS

CN 104798209 A * 7/2015 ............. C03C 3/125
CN 104798209 A 7/2015
(Continued)

OTHER PUBLICATIONS

Machine translation of CN-104798209-A, Takei Shodo. (Year: 2015).*

Primary Examiner — Mayla Gonzalez Ramos
(74) Attorney, Agent, or Firm — Leason Ellis LLP

(57) ABSTRACT

The invention discloses a conductive paste for forming the electrode on the surface of solar cell, which contains conductive powder, mixed glass and organic phase; wherein, the mixed glass comprises the following two types of glass components: the first type of glass is at least one selected from the tellurium glass which does not contain lead sub- (Continued)

stantially and having tellurium, bismuth, lithium as the essential component;

The second type of glass is at least one kind of lead silicate glass, which having lead and silicon as essential components and does not contain tellurium substantially. The invention also provides a solar cell prepared by printing the conductive paste as a surface electrode and a manufacturing method of the solar cell. The solar cell made of the conductive paste of this invention has good EL performance in inspection, excellent ohmic contact of the cell, high cell conversion efficiency, better reliability, and strong bonding strength, the adhesion performance is taken into account while improving reliability and ohmic contact.

6 Claims, 3 Drawing Sheets

(56) References Cited

FOREIGN PATENT DOCUMENTS

| | | | |
|---|---|---|---|
| CN | 106098138 | A | 11/2016 |
| CN | 106504814 | A | 3/2017 |
| JP | 2009194141 | A | 8/2009 |
| JP | 5559509 | B2 | 6/2014 |
| JP | 5782112 | B2 | 7/2015 |
| JP | 5856277 | B1 | 12/2015 |
| JP | 5937689 | B2 | 5/2016 |
| JP | 6074483 | B1 | 1/2017 |
| KR | 20130052992 | A | 5/2013 |

* cited by examiner

THICK-FILM CONDUCTIVE PASTE, AND THEIR USE IN THE MANUFACTURE OF SOLAR CELLS

FIELD OF THE INVENTION

The invention mainly relates to an electrode paste composition suitable for manufacturing with no defect and reliable solar cell electrode under EL inspection, a solar cell using the paste and a manufacturing method thereof.

TECHNICAL BACKGROUND

The conventional solar cell is to set a conductive semiconductor layer with opposite electric property on the conductive semiconductor substrate (hereinafter referred to "PN junction") underneath of antireflection film and the light receiving surface (hereinafter referred to "front side") electrode, and at the back side of cell, having a back electrode structure. (hereinafter when front and back are not specified, both electrode is referred to as "electrode".)

The electric energy generated by the PN junction of the semiconductor after receiving light is extracted from the electrode.

Assuming the above semiconductor substrate is p-type crystalline-Silicon substrate, the electrically opposite charged layer of light receiving surface is n+, the backside semiconductor is p+. While maintaining sufficient light transmittance, the above-mentioned antireflection film can reduce the surface reflectivity and improve the light receiving rate, it is generally composed of silicon nitride, titanium dioxide, silicon dioxide and other films. Solar cells with multilayer structure are also widely used. For example, the cell structure with protective layer (passivation layer, generally composed of alumina, silicon oxide, etc.) to improve efficiency. And the cell, structured with conductive oxide layer is called TOPCON (Tunneling Oxide passivated contact).

The other cell structure is also existing that can absorb sunlight both on the back side and the front side, is called the bifacial solar cells.

The resistance value of the mentioned above anti-reflection film is extremely high. To achieve the full extraction of the electric energy generated by the semiconductor PN junction, front side electrode must remove the antireflection film underneath electrode. Therefore, the front side electrode of solar cell is formed by fire through method. The antireflection film is formed firstly on the n+ layer. Then thick-film conductive paste is printed on the antireflection film by screen printing method and is dried/fired immediately after printing. During firing process, electrode material is heated and melted and dissolved the antireflection film in contact area with the electrode material, thus ohmic contact is formed between front side electrode with semiconductor substrate.

The main components of the front side conductive paste are silver powders, glass powder (the glass raw materials are melted and quenched, and then it is made into powders, after ball milling as required) organic phase and organic solvent.

During the firing process, the glass powder components in the conductive paste do fire through the antireflection film, and the conductive components in the conductive paste form ohmic contact with n+ layer. Therefore, compared with removing part of the antireflection film before forming the electrode, the process is simpler, and there is no problem of alignment off-set at removed part of an antireflection film and an electrode.

Forming the above front side electrode, it is necessary to ensure bonding strength and reduce contact resistance, maintain good ohmic contact between semiconductor substrate and electrodes, and required higher cells conversion efficiency. Based on such requirements on solar cells, many proposals and suggestions for improvement had been proposed. Among of them, the most useful method was using tellurium glass.

The role of tellurium in the glass components is network former. It increases the amount of silver dissolved in glass to decrease contact resistance. During the cooling of firing process, tellurium can inhibit precipitation of silver. Therefore, it broadens the firing process window and inhibit excessive etching of semiconductor substrate.

By the above functions, antireflective film can be adequately etched to ensure good contact between front side electrode with substrate. In parallelly electrode material can be inhibited to penetrate into PN junction areas. So that good ohmic contact is easier to be formed and electrical performance of solar cells should also be able to improve. In addition, well controlled fire through depth helps to form thinner PN junction layer of front side of solar cells.

The following patents are available for using tellurium glass in solar cells electrode paste composition.

Japanese patent bulletin No. 5782112 (patent 1), the use of lead-tellurium glass has been proposed, the purpose is, under low temperature firing condition, to form electrode through antireflection film, therefore it forms a good ohmic contact between substrate with electrode.

Japanese patent bulletin No. 6074483 (patent 2), in which an electrode paste containing lead-tellurium glass has also been proposed to improve cell performances. It mentions in paragraph [0076], the bonding strength between electrode and substrate is decreased with increasing amount of PbO in glass. This effect on bonding strength can be thought to be related with morphology of substrate/electrode interface. This is to say, in glass powder composition if contains PbO without rigid materials like SiO2, the glass etches substrate and forms good contact between substrate and electrode. However, if there is too much PbO, substrate is etched more and uniformly, etched interface of substrate become smoother surface. As a result, bonding strength is weakened between electrode with substrate.

To solve this problem, many researchers are committed to develop lead-free glass containing electrode paste.

Japanese patent bulletin No. 5559509 (patent 3) has claimed, the conductive paste for solar cells, composed of Silver as conductive phase, glass powders, organic phase, solvent, using tellurium based glass powder that used tellurium as network former, is to reduce contact resistance between front side electrode with substrate. A contact resistance is mainly related to the composition of the glass.

That is to say, contact resistance is affected by tellurium oxide and other glass powder components (tungsten oxide and Molybdenum oxide) therefore it is difficult to keep low contact resistance through wide range of glass powder components combination.

For the same purpose, In lead-free glass components, in order to simultaneously reduce contact resistance between electrode and substrate and front side electrode line resistance, It has been claimed that conductive paste using glass powder, comprising of Te, Bi, Zn, and its oxides total mole % is more that 95 (mole %) in Japanese patent bulletin No. 5937689 (patent 4). And the corresponding each oxides the most preferable range is, Te 40~90 (mol %), Bi 1~20 (mol %), Zn 5~50 (mol %), and the total Si, B, Al, Zr, Ba, Mo and La in glass are less than 5 (mol %).

In addition, lead amount less than 0.1 (wt %) of lead-free conductive paste has been proposed, to obtain good solar cell performance, it is suggested to add at least one of Mg, Ca, Sr and Ba into glass and/or additives in conductive paste. And adding amounts: for 100 weight part of conductive powder, after conversion in accordance with elements, most preferably contents range in 0.1~10 weight part.

(Japanese public patent bulletin No. 2009-194141 (patent 5).

In this patent, no special restrictions were mentioned regarding to glass components, but examples are shown, lead-free glass such as $Bi_2O_3$-$B_2O_3$-$SiO_2$-$CeO_2$-$LiO_2$-$NaO_2$ glass and $SiO_2$-$B_2O_3$-$Li_2O$ glass.

Japanese patent bulletin No. 5856277 (patent 6), it has claimed to use lead-free glass that must contain tellurium, bismuth, zinc and lithium as essential elements.

In paragraph [0010] of patent 6, the composition from patent 3 to patent 5 is summarized as follow:

"Solar cells using disclosed conductive paste for front side electrode comprising of lead-free frit, are expected to manage high bonding strength between substrate with electrode, and also improve solar cell performance, especially low contact resistance and line resistance, but there were no particularly satisfactory results."

In addition, the characteristics of paste using lead-free glass are also described, "Although the good bonding strength can be achieved easily by adjusting soft point of glass. But compared with lead glass, lead-free glass was much harder to control the degree of etching for good ohmic contact."

As described above, using lead-free glass for conductive paste is easy to obtain better bonding strength, which met with bonding strength requirements of poly crystalline silicon cells that was majority of solar cells market until recently. Therefore, it has been popular to use lead-free glass into conductive paste.

On the other hand, in solar cell market, cells manufacturers are eager to achieve higher conversion efficiency and, in same time, eager to achieve better reliability.

Better reliability is referred as long-term stable power output from installed solar cells modules, guarantee for 25 years in recent industry standard.

Research on improving reliability of solar cells has been progressed continuously, and various adverse factors that could harm reliability are also being discussed.

Referred to International Energy Agency, IEA, PHOTOVOLTAIC POWER SYSTEMS PROGRAMME, Reviewing the practicality and utility of electroluminescence and thermography images, M. Kontges Institute for Solar Energy Research Hamelin.

In order to ensure better reliability of solar cell module, a newly developed inspection method has been introduced into solar cell industry, it also generates new requirement to electrode paste. The new inspection method is EL (Electro Luminescence) inspection.

EL inspection is to apply an electric field on solar cell, electrons and holes in solar cells are recombined and grows electro luminescence. The pictures of luminous part are taken and analyzed. When an electric field was applied, the position that charge flows through is lighting, and the part that no charge passed through becomes dark. Using this feature, it is able to identify defects and problems that cannot be seen from naked eye inspection, thus ensuring its better reliability.

With this new inspection method, researchers realized that black spots or cloudy spots of EL picture that affects cell reliability, occurs frequently in solar cells that used lead-free tellurium glass bearing electrode paste. The examples of EL inspection photos are shown in FIG. 1, which included test results of four solar cells. Among them, (1)-(3) all show poor EL result. (4) has good EL result. But (4) has low bonding strength.

THE DESCRIPTION OF INVENTION

The invention provides a conductive paste, which is used on a solar cell and a solar cell manufacturing method. The solar cells use this invention achieve better EL inspection, better reliability and good ohmic contact. And cells also have high conversion efficiency and excellent bonding strength.

The technical aspects of this invention are as follows.

A conductive paste is used to form a surface electrode, which contains a conductive powder, mixed glass powders and organic phase.

Wherein, the mixed glass powder comprises of the following two types of glasses. At least one type of glass (I) is chosen from lead-free glass, of which tellurium, lithium and bismuth are essential components. The other type of glass (II) is chosen from at least one of tellurium-free glass that contains Lead and Silicate as essential elements.

In the conductive paste described above, contains at least one or mixture of lead-free, tellurium baring glass (I), of which lithium, bismuth and tellurium are essential components. The other type glass (II) is selected from at least one or mixture of lead-silicate glass that is essentially free of tellurium and consists of lead and silicon.

In the conductive paste described above, the mass ratio between total amount of tellurium glass (I) and total amount of lead silicate glass (II) of mixed glass is 2:8~8:2.

In the conductive paste described above, the tellurium glass (I) is converted into an oxide of 44~76% tellurium, 7~51 mol % bismuth, and 2~14 mol % lithium.

In some embodiments of the invention, the tellurium glass may also contain any one or more oxides of tungsten, zinc, silicon, sodium, aluminum, and copper.

In the conductive paste described above, the described lead-silicate glass (II) contains one or some of zinc, tungsten, lithium, sodium, aluminum, and copper. The metal oxide conversion of mentioned lead-silicate glass, lead is 39 to 70 mol %, silicon is 20~43 mol %, zinc, tungsten, aluminum, copper, sodium, lithium total of 0~20 mol %.

In the conductive paste described above, on the condition of realizing the invention purpose, the mixed glass of paste as described above may also contain other types of glass. In that case, for the 100% mass portion of mixed glass, the total mass portion of type I and II exceeds 50%.

The paste as described above, for conductive powder with a 100 mass, the total content of mixed glass is controlled at a mass of about 0.1~10.

The invention also provides a solar cell, which has of semiconductor substrate, antireflection film arranged in the first area on the surface of the semiconductor substrate, and a surface electrode arranged in the second area on the surface of the semiconductor substrate, wherein the surface electrode is printed from any of the conductive pastes. The above surface refers to the front and/or back of the semiconductor substrate.

The invention also provides a manufacturing method of a solar cell, wherein the solar cell has a semiconductor substrate, an antireflection film arranged on the first area on the surface of the semiconductor substrate, and a surface electrode arranged on the second area on the surface of the semiconductor substrate, wherein the manufacturing method is mainly divided into the following three steps:

The first step is to form anti-reflection film on the surface of semiconductor substrate.

The second step is: the paste containing conductive powder, mixed glass and organic phase is printed on anti-reflection film formed in the first step. Wherein the mixed glasses are mainly composed of one type of tellurium bearing lead-free glass, of which lithium, bismuth and tellurium are essential components. The other type of glass is selected from at least one type of lead-silicate glass that is substantially free of tellurium and consists of lead and silicon.

The third process is: firing the conductive paste. During firing process antireflection layer underneath of conductive paste is etched.

At the end, antireflection film is formed at the first area of the semiconductor substrate. surface electrode is formed at the second area of the semiconductor substrate.

The surface refers to the front and/or back of semiconductor substrate.

In the above conductive paste, at least one type of tellurium bearing lead-free glass (I), of which lithium, bismuth and tellurium are essential components. The other type glass is selected from at least one type of lead-silicate glass (II) that is essentially free of tellurium and consists of lead and silicon.

The invention also claims protection of a glass powder for solar cells, which is a mixture of glass (I) and glass (II) of any of the above mentioned.

Comparing to conventional technology, the effects of the invention are as follows.

The invention provides a conductive paste, which is used on a solar cell and a solar cell manufacturing method. The solar cell uses this invention achieve better EL inspection, better reliability and good ohmic contact. And cells also have high conversion efficiency and excellent bonding strength.

Figure 1:
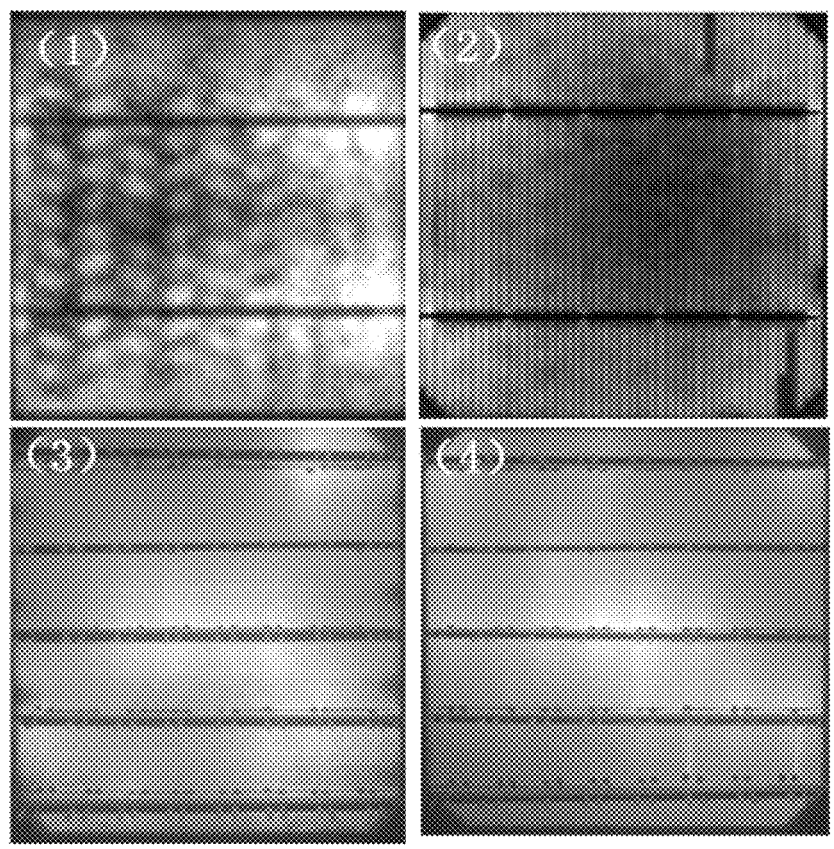
FIG. 1 is a photo of EL inspection of several solar cells using conventional technology.

The labels in the figures have the following meanings:
1—semiconductor substrate; 1a—n-type semiconductor layer; 1b—p-type semiconductor layer; 2—antireflection film (including or excluding protective layer); 3—front side electrode; 4—back side electrode; 5a, 5b . . . 5n—finger line electrode; 6—busbar electrode; 7—collector electrode; 8—output electrode

DETAILED DESCRIPTION

The invention relates to a conductive paste and a solar cell prepared from it and a manufacturing method thereof.

The inventor studied existing lead-free tellurium glass in the prior art of technology of the invention, it is confirmed that bismuth is used as an essential component in all the lead-free tellurium glass disclosed in the patent 4-6.

The inventor understands that Bismuth component in lead-free tellurium glass can adequately reduce the etching inhibition role of tellurium to improve the glass etching ability.

However, bismuth-containing lead-free tellurium glass is easy to do phase separation during heating and melting, the high fluidity part and low fluidity part will be separated and behave differently. The high fluidity part etches deeper.

According to inventor research, this is the reason why not uniform ohmic contact is formed between substrate and electrode paste.

Previously, this "not uniform ohmic contact" was not known well, but with introduction of EL inspection, it becomes well known fact.

The emergence of this problem generates new requirement for the conductive paste. That is, while ensuring good bonding strength, ohmic contact should be uniform. So, a paste that can achieve good contact and bonding strength under EL inspection, is needed to be developed.

Regarding this problem, the invention provides an electrode paste which can guarantee both electrical performance and bonding strength, which also presents good contact under the EL inspection, that is, a conductive paste used for printing the surface electrode on the solar cell.

In order to achieve the above purpose, inventor has conducted a lot of research and finally confirmed that the paste with only tellurium containing lead-free glass is more prone to black spot caused by not uniform ohmic contact in EL inspection. To ensure good ohmic contact, the firing temperature should be increased generally, however it leads to cloudlike black spots for over fired. That is, good firing temperature window is particularly narrow and difficult to maintain.

To solve this issue, inventor found through a lot of research and analysis that if the tellurium bearing lead free glass with specific components and proportions, and the lead glass without tellurium with specific composition and proportion are used together in conductive paste, it performed good EL image at inspection.

The proposal of the invention is based on the above discovery of inventor.

The invention relates to the conductive paste which is applicable for solar cell electrode, specifically composes of conductive powder and substantially lead-free glass with tellurium, bismuth and lithium, as its essential components, and substantially tellurium-free glass with lead and silicon as its essential components.

In Japanese patent bulletin No. 6175392 (patent 7) it has disclosed the composition of conductive paste which is applicable for electrode on the surface of solar cell, similar application with this invention.

It is composed of conductive powder, mixed glass with organic phase.

Mixed glass refers to a tellurium bearing glass which tellurium, tungsten, and bismuth as essential components and to a substantially tellurium-free lead bismuth glass.

However, according to the results described later in this invention, the glass composition disclosed in patent 7 does not achieve the purpose of this invention, that is, it does not solve the problem of poor ohmic contact found in EL inspection.

Therefore, not all combinations of tellurium glass and lead glass can achieve good effect of EL inspection. Only the specific glass combination of invention can achieve good EL inspection and good bonding strength at the same time.

In addition, in Chinese patent No. 103377752B (patent 8), the inorganic reaction system of the conductive paste has been disclosed. That is, a mixture of lead-based glass and tellurium glass are used.

However, according to the results described later in this invention, it is confirmed that patent 8, like patent 7, fails to solve the appearance problem in EL inspection as highlighted benefit of this invention.

In this invention, the range represented by "one value to another" is a general representation way to avoid listing all the values in that range. Thus, the record of a specific range of value covers any value within the range and the smaller value of range defined by any value within the range, just like the description states clearly any value in the values of range.

The embodiment of invention is described in detail below. These embodiments and examples are used only to describe the invention and not to limit the protection for the scope of the invention. The improvement and adjustment in application by technical personnel based on this invention shall still belong to the scope of protection of this invention.

Figure 2:
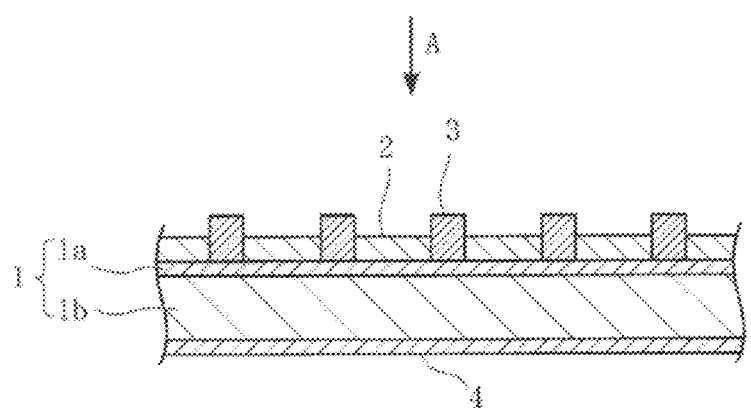
FIG. 2 is cross section diagram of solar cell manufactured with the conductive paste related to the invention.

FIG. 2 is a cross-section view of an important part of a solar cell manufactured using a paste related to the invention.

The semiconductor substrate mainly consists of silicon 1, antireflection film 2 formed on semiconductor substrate 1, a front side electrode 3, and a back electrode 4 formed on semiconductor substrate 1

More specifically, semiconductor substrate 1 has a p-type semiconductor layer 1b and n-type semiconductor layer 1a, and the above p-type semiconductor layer 1b, formed n-type semiconductor layer 1a.

Specifically, for example, by diffusing impurities on one surface of p-type semiconductor layer 1b of monocrystalline or polycrystalline, the semiconductor substrate 1 can be obtained. But for the invention, as long as the n-type semiconductor layer 1a can be formed on the top of p-type semiconductor layer 1b, there are no special restrictions and requirements on its structure and manufacturing method.

In addition, semiconductor substrate 1 may be used to form a thin p-type semiconductor layer on surface of n-type semiconductor layer, or it may be used to form both p-type semiconductor layer and n-type semi-conductor layer on surface of semiconductor substrate 1. Regardless of the structure, the conductive paste in the invention can be used on antireflection film 2 on the surface of semiconductor substrate 1.

In addition, in FIG. 2, the surface of semiconductor substrate 1 is flat and smooth, in order to reduce reflection of sunlight and increase gain in semiconductor substrate as much as possible, the surface is texturized actually.

Antireflection film 2, which is formed by insulating materials such as silicon nitride (SiNx), is used to inhibit reflection of sunlight as shown by arrow A on front side, so as to adopt sunlight to semiconductor substrate 1 quickly and efficiently. The composition of antireflection film 2 is not limited to silicon nitride mentioned above, but also can be used with other insulating materials, such as silicon oxide and titanium oxide, or two or more insulating materials can be used at the same time. In addition, for semiconductor substrate, as long as it is crystalline silicon, whether mono- or polysilicon can be used. In this invention, antireflection film 2 may include or exclude a passivation layer (a passivation layer improves efficiency by protecting the semiconductor layer below the antireflection film, generally composed of alumina, silicon oxide, so on.)

The front side electrode 3 is formed by fire-through anti-reflection film 2 on the semiconductor substrate 1. By screen printing method, paste of invention is coated on semiconducting substrate 1 to form a conductive film, then electrode 3 is formed by firing. In other words, in forming front side electrode 3 during firing process, the antireflection film underneath of conductive film is decomposed and removed, fire-through, so that front side electrode 3 and antireflection film 2 is connected together on the top of semiconductor substrate 1 and front side electrode 3 electrically connected to semiconductor substrate 1.

Figure 3:
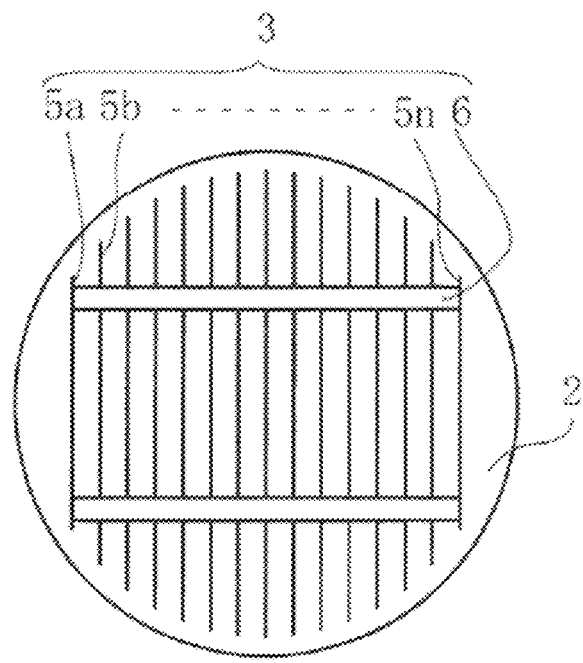
FIG. 3 is an enlarged planar model diagram of front side electrode.

The specific structure of receiving electrode 3 is shown in FIG. 3. Many finger line electrodes 5a, 5b . . . 5n are arranged together like teeth of a comb, while busbar electrode 6 and finger line electrode 5a, 5b . . . 5n are set in a cross position. Finger line electrode 5a, 5b . . . 5n and busbar electrode 6 are electrically conductive. In addition, antireflection film 2 is formed at outside of front side electrode 3. As it is shown, electricity generated by semiconductor substrate 1 is passed through finger line electrode 5a, 5b . . . 5n, is collected and is extracted to the outside through busbar electrode 6.

Figure 4:
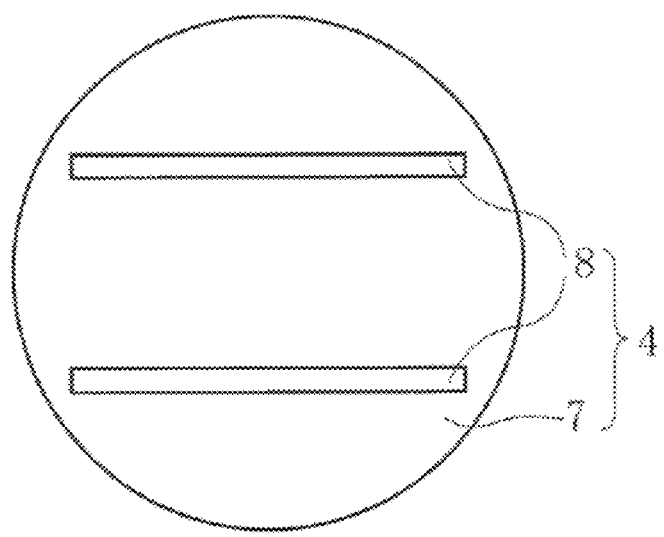
FIG. 4 is an enlarged planar model diagram of back side electrode.

The back electrode 4, as shown in FIG. 4, is composed of collector electrode 7, composed of Al and such like materials, formed on the back of the p-type semiconductor layer 1b, and an output electrode 8 formed by an Ag or the such like conducting materials with the collecting electrode 7. The electric energy generated by the semiconductor substrate 1 is collected by the collector electrode 7, and then the electric energy is exported by output electrode 8.

In the following, front side conductive paste 3 of the invention is described in detail.

The conductive paste in the invention mainly consists of conductive powder, mixed glass and organic phase. The mixed glass contains of two kinds of glass powder materials, one of which is substantially lead-free and composed of tellurium bismuth lithium as essential elements, and at least one of such tellurium bearing glass, another glass is at least one type of lead silicate glass that is substantially tellurium free and has lead, silicon as an essential components.

In the conductive paste described above, the first type of glass may contain one or multiple of tellurium bearing glasses containing no lead substantially and of which tellurium and bismuth, lithium are essential components. The second type of glass may contain one or multiple of lead silicate glasses with lead and silica as essential components and substantially free of tellurium. In the following descriptions, if specific composition of each element in each glass is not indicated, the element is contained in glass as an oxide. Hereby, "substantially free" of a component X means that a small amount of component X is actually unavoidable, or it is not excluded that a small amount of component X can be added in order to utilize the essence of this invention without affecting the realization of the purpose of the invention.

In addition, a conductive paste formed front side electrode 3, is comprising conductive powder, mixed glass, appropriate additives, and organic phase. The paste may also be a rheological slurry, coating, or ink-like composition, which is suitable for other printing methods than screen printing The content of mixed glass in conductive paste can be referred to the usual usage amount of the paste used for the solar cell electrode. For example, content of mixed glass should be controlled within the mass portion of 0.1-10 preferably, For the conductive powder with a mass of 100, if the mass of the mixed glass is more than 0.1, the adequate density and bonding strength can be obtained.

In addition, for a conductive powder with mass portion of 100, if the mass portion of mixed glass is less than 10, the surface of the electrode will float out of the glass, and the glass flowing into the interface of the diffusion layer of the electrode and semiconductor substrate which can help reduce contact resistance. There are no specific restrictions, but in this implementation, tellurium glass and lead silicate glass in conductive paste have an average particle size of 0.5~3.0 micron meters, which is adequate.

For conductive powders, there is no restriction other than the requirement that main ingredient is silver. Its shape can be spherical, flake and dendritic, etc. . . . powders has been used in paste industry are all usable. In addition to pure silver powder, at least surface is a silver layer of silver-coated composite powder, or silver as main component of alloy can be used. The average particle size of conductive powder, such as silver powder, average size 0.1~10 micrometer is preferred. In addition, average particle size, particle distribution, different shape of two or more kinds of conductive powder mixture is also usable. Even mixture of silver powders with conductive powders other than silver, can be usable.

The above "main ingredient" refers to the ingredient with mass portion more than 50 percent and the most preferably with mass portion more than 70 percent.

In addition, a metal mixed with silver powder or alloy is also suitable. There is no other limitation if no damage to the effect of this invention, such as aluminum, gold, palladium, copper, nickel, so on.

However, from the viewpoint of electrical conductivity, silver is recommended.

For organic phase, there is also no special restriction, the conventional organic phase which is used in silver paste, such as organic resin and solvents are applicable.

For resin, cellulose, acrylic resin, phenol resin, alkyd resin and pain tree rosin can be used as organic resin.

For solvents, alcohol, ether, ester, hydrocarbon, and other organic solvents, or water, as well as mixed solvents of the above.

There is no special requirement for the proportion of organic phase, as long as the adequate amount is applied, the paste can be formed with conductive powder and mixed glass and other inorganic components, and then it can be adjusted reasonably depends on coating methods. However, in generally, for the conductive powder with mass portion 100, the mass portion of organic phase is about 5 to 40 range.

Other components may be used as required, additives are commonly used such as plasticizers, viscosity stabilizer, surfactants, oxidizers, metal oxides, metal organic compounds, so on, as long as they are not damaging the effect of the invention and its embodiments.

In addition, silver compounds such as silver carbonate, silver oxide and silver acetate can also be used. In order to optimize the firing temperature and improve the characteristics of solar cells, copper oxide, zinc oxide, tungsten oxide and titanium oxide can also be added appropriately.

The above-mentioned tellurium glass, if convert into oxides, tellurium is 44~76 mol %, bismuth is 7~51 mol %, and lithium is 2~14 mol %.

In the above mentioned tellurium glass, tellurium plays the role of network former, as mentioned above, it can increase the silver dissolution in the glass and reduce the contact resistance. At the cooling stage of firing, it can inhibit the silver precipitation, broaden the firing window, and inhibit the etching of semiconductor substrate. Through these functions, the insulating film can be sufficiently etched to ensure a good contact between the electrode material and the substrate, at the same time, due to restriction of the electrode material entering into the semiconductor layer such as PN junction, it will be easier to form good ohmic contact, and the conductivity will also be improved, and the solar cell electrical performance can also be improved.

Furthermore, it is easier to control the fire through, which is also helpful for apply thin layer of the semiconductor layer on the front side.

If the content of tellurium is less than 44 (mol %), it will not be able to dissolve sufficient amount of silver into the glass, and if it is more than 76 (mol %), the effect of etching inhibition will be too strong to get enough fire-through.

In addition, bismuth is the component to increase the softening point of glass, which can be added for adjusting softening point of low viscosity of tellurium glass. In addition, it can also give etching ability to glass. Although as mentioned before, tellurium has a strong etching inhibition effect, it can also be properly controlled by adjusting the bismuth content appropriately. But if the content of bismuth exceeds 52 (mol %), the glass will be crystallized easily.

In addition, lithium can reduce the softening point of glass and is also a donor. For n-type semiconductors, through the mutual diffusion between semiconductor substrate (such as silicon substrate) and electrode material, the donor concentration near the interface will be decreased, and lithium can play a role of compensation donor. If the content of lithium is less than 1 (mol %), it cannot compensate donor, but if the content is more than 14 (mol %), the etching will be too strong, and the stability of the glass will decline.

In addition, generally, alkali metal components have a negative effect on solar cell characteristic. Therefore, it is better not to use it. For example, Na will lead to reduce Voc, and K will lead to FF decrease and to increase contact resistance. Moreover, Na and K do not form donors, so there is no advantage to use.

Lithium has a donor compensation role, so it is useful in the formation of n-type semiconductor electrodes, which can obtain better characteristic of solar cells.

In addition, rather than tellurium, bismuth and lithium, tellurium glass may contain any of oxide chosen from tungsten, zinc, silicon, sodium, aluminum, and copper.

In terms of lead-silicate glass, lead and silicon is as essential components, but also can contain any of oxide chosen from zinc, tungsten, sodium, lithium, aluminum, and copper.

The conversion of each element into oxide, the content is: lead 39~70 mol %, silicon 20~43 mol %, zinc, tungsten, sodium, lithium, aluminum, copper total 0~20 mol %.

Lead is mainly used to form network of lead-silicate-glass. Lead has ability to form glass by itself and has a content range from 39 to 70 mol %. Within this range, the fire-through ability will be improved.

Silicon, especially in the mentioned lead-silicate-glass, can help to form glass network and adjust soft point easily. Converted to oxide, silicon content is from 1 to 50 mol %, it is easier to form glass. The preferred content range is from 20 to 43 mol %. Once content exceeds 50 mol %, soft point will become too high. Against lead's network formation component, Silicon will hinder network formation.

In lead-silicate-glass, mentioned before, can also contain zinc, tungsten, sodium, lithium, aluminum, copper in any one or more. The content of these elements converted into oxides, is less than 20 mol %.

In order to obtain good EL inspection results and a better reliability surface electrode, the mass ratio of tellurium glass and lead silicate glass of mixed glass is controlled to 2:8~8:2.

In addition, to mixed glass compose of at least a mixture of tellurium glass and lead silicate glass, it may contain additional glass with the condition of no damage on the effect of this invention.

As mentioned above, conductive paste made by using mixture of substantially lead-free glass, of which tellurium and bismuth, lithium are essential components, and substantially tellurium-free glass, of which lead and silicon, can be used to make front side electrode which demonstrate good ohmic contact and good bonding strength without any EL inspection problem.

This effect, however, is not achievable with above mentioned tellurium bearing glass alone or with lead silicate glass alone, nor with lead tellurium glass alone.

EMBODIMENTS OF THE INVENTION

Embodiment 1

To make tellurium glass: TeO2, Bi2O3, WO3, ZnO, Al2O3, LiO2, B2O3 were prepared. The ratio shown in table 1-1, table 1-2, and table 1-3. These raw materials were weighed and mixed, then glasses A-1~A-5 were made.

TABLE 1-1

Glass compositions were converted into oxide mol %

| | mol % | | | | | | |
|---|---|---|---|---|---|---|---|
| | Te | Bi | W | Zn | Al | Li | glass status |
| A-1 | 50 | 10 | 40 | | | | good |

TABLE 1-2

| | mol % | | | | | | |
|---|---|---|---|---|---|---|---|
| | TeO2 | Bi2O3 | WO3 | ZnO | Al2O3 | Li2O | glass status |
| A-2 | 89 | 1.0 | | 9.6 | 0.4 | | good |
| A-3 | 55.0 | 19.9 | | 24.3 | 0.8 | | good |
| A-4 | 74.42 | 12.07 | | | | 13.51 | good |

TABLE 1-3

| A-5 | TeO2 | B2O3 |
|---|---|---|
| wt % | 93 | 7 |
| Mol % | 85.3 | 14.7 |

Among them,

A-4 is an embodiment of tellurium glass defined as substantially lead-free and with tellurium, bismuth and lithium as essential components, the rest of glasses are for comparison.

Specifically, A-1 is a glass of tellurium, bismuth, and tungsten (recipe in patent 7)

A-2 and A-3 is a glass of tellurium, bismuth, zinc as main component and aluminum was added.

A-5 is a glass of boron and tellurium (recipe in patent 8)

Production lead-silicate-glass: PbO, Bi2O3, WO3, ZnO, SiO2, Na2O, B2O3, Al2O3, LiO2, TiO2, were prepared, as shown in table 2-1, table 2-2, and table 2-3. These raw materials were weighed and mixed, then glass B-1~B-8 were made.

TABLE 2-1

| | mol % | | | | | | | |
|---|---|---|---|---|---|---|---|---|
| | Pb | Bi | Zn | W | Si | Na | Li | B | glass status |
| B-1 | 40 | 30 | 20 | | | | | 10 | good |

TABLE 2-2

| B-2 | PbO | B2O3 | SiO2 | Al2O3 | TiO2 |
|---|---|---|---|---|---|
| wt % | 79.03 | 4.11 | 7.09 | 6.01 | 3.77 |
| Mol % | 55.56 | 9.26 | 18.52 | 9.26 | 7.41 |

TABLE 2-3

| | mol % | | | | | | | | glass status |
|---|---|---|---|---|---|---|---|---|---|
| | PbO | Bi2O3 | ZnO | WO3 | SiO2 | Na2O | Li2O | B2O3 | |
| B-3 | 50.0 | | 1.9 | 0.7 | 37.3 | 2.6 | 7.5 | | good |
| B-4 | 50.4 | | 1.9 | | 37.5 | 2.6 | 7.6 | | good |
| B-5 | 51.3 | | 1.9 | 0.8 | 38.3 | | 7.7 | | good |
| B-6 | 50.9 | | | 0.8 | 37.9 | 2.7 | 7.7 | | good |
| B-7 | 79.6 | | 3.0 | 1.2 | | 4.2 | 12.0 | | not melted |
| B-8 | 54.1 | | 2.0 | 0.8 | 40.3 | 2.8 | | | good |

B-2 to B-6 and B-8 are examples of lead silicate glasses with lead silicon as an essential component and substantially no tellurium.

B-1 and B-7 are comparison examples, which do not belong to lead silicate glass, in substantially tellurium free glass.

B-1 is a lead bismuth glass that contains lead and bismuth as essential components and substantially tellurium free. (recipe in patent 7).

B-2 is also the components in patent document 8.

From B-3 to B-8 are a series of examples to check necessity of zinc, tungsten, silicon, sodium, and lithium. Among them, B-3 is an example consists of zinc, tungsten, silicon, sodium, and lithium.

B-4 is an example of without tungsten.

B-5 is an example of without sodium.

B-6 is an example of without zinc.

B-7 is an example of without silicon.

B-8 is an example of without lithium.

In addition, for conductive powder, spherical silver powder which is 2.0 μm average particle was prepared.

Organic phase production: 10 wt % ethyl cellulose and 90 wt % Octanol were mixed and heated for making solution.

Then, silver powder (88.0 wt %), glasses total (2.6 wt %) and rheology modifier such as fatty acid amide, fatty acid, and the above organic compounds were mixed.

After the planetary mixer mixing, the three-roll machine was used for mixing and dispersing to make a conductive paste.

The manufacturing method of making solar cells with the above-mentioned conductive pastes was as follows.

The silicon semiconductor substrate (156 mm square) for monocrystalline silicon solar cells, texturized surface, sheet resistance is 90 Ω/sq., with SiNx antireflection film on phosphorus diffusion emitter layer, were purchased from Huachang company.

Another type of silicon semiconductor substrate (156 mm square) for monocrystalline silicon solar cells), texturized surface, sheet resistance is 90 Ω/sq., atomic layer deposited aluminum oxide (ALD-Al2O3) passivation layer on phosphorus diffusion emitter layer with SiNx antireflection film were purchased from Tongwei company.

Next step was to prepare aluminum paste with Al as main component, back side silver paste with Ag as main component. Then an appropriate amount of aluminum paste and silver paste were coated on the back side of silicon semiconductor substrate that mentioned above. The back electrode was formed after drying.

The conductive paste in this invention was screen printed on the surface of silicon semiconductor substrate to dorm front side electrode.

The mesh screen used for printing was 5 busbar patterns.

After printing, belt IR furnace (produced by Despatch company, dry and fire integrated type) The drying and firing were completed according to the conditions in table 3 below.

TABLE 3

| | Zone setting temp.(degC) | | | | | | | | |
|---|---|---|---|---|---|---|---|---|---|
| Belt speed | Zone.1 | Zone.2 | Zone.3 | Zone.4 | Zone.5 | Zone.6 | Zone.7 | Zone.8 | Zone.9 |
| 255 inch/min. | 280 | 290 | 300 | 500 | 550 | 650 | 720 | 820 | 895 |

Sample Evaluation

The fired solar cells were tested by EL inspection device (Geonic automation). Then solar cells EL photos of no black dots (black dots represent bad EL) were measured conversion efficiency by I-V tester (Pasan). Depended on evaluation purpose, no good EL cells were also measured conversion efficiency.

Ten pieces were measured per sample if no cells were damaged during evaluation process. Bonding strength was measured by a self-made automatic tension tester using a 180-degree peel method.

Figure 5:
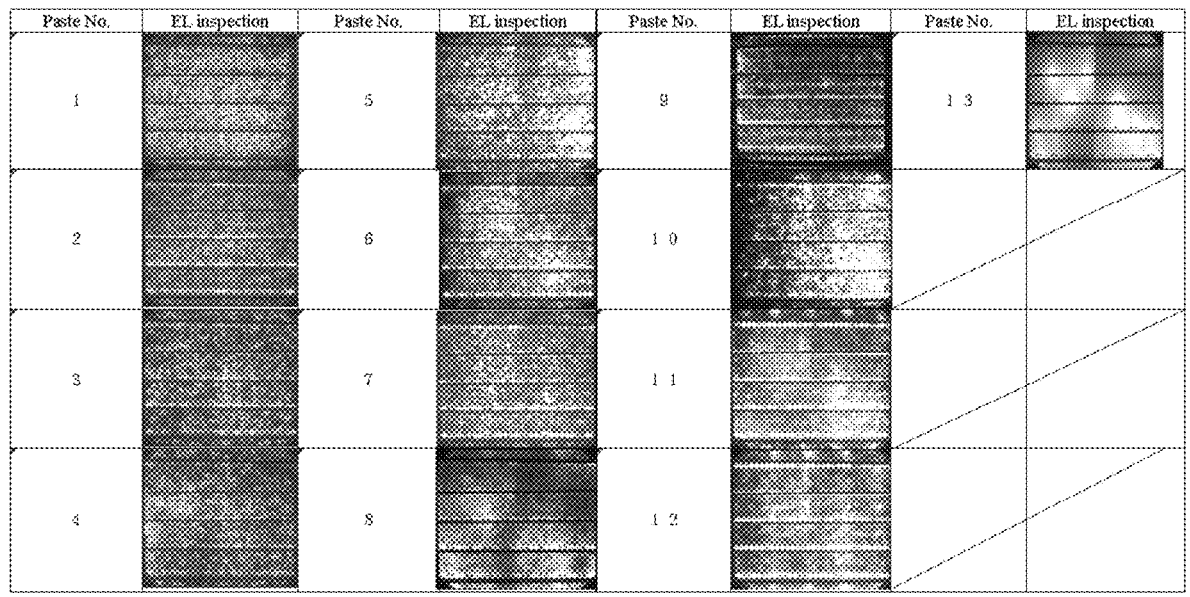
FIG. 5 are EL test pictures of the samples number 1-13.

Table 4 and FIG. 5 shows the glass ratio and test results.

TABLE 4

| Paste No. | Lead-free, Tellurium glass | wt % | Lead-Silicate glass | wt % | EL inspection | cell efficiency(%) |
|---|---|---|---|---|---|---|
| 1 | A-1 | 2.6 | | | NG | N.A |
| 2 | A-2 | 2.6 | | | NG | N.A |
| 3 | A-3 | 2.6 | | | NG | N.A |
| 4 | A-4 | 2.6 | | | NG | N.A |
| 5 | A-1 | 1.625 | B-1 | 0.975 | NG | N.A |
| 6 | A-2 | 1.625 | B-1 | 0.975 | NG | N.A |
| 7 | A-3 | 1.625 | B-1 | 0.975 | NG | N.A |
| 8 | A-4 | 1.625 | B-1 | 0.975 | NG | N.A |
| 9 | A-5 | 2.79 | B-2 | 0.9 | NG | N.A |
| 10 | A-1 | 1.625 | B-3 | 0.975 | NG | N.A |
| 11 | A-2 | 1.625 | B-3 | 0.975 | NG | N.A |
| 12 | A-3 | 1.625 | B-3 | 0.975 | NG | N.A |
| 13 | A-4 | 1.625 | B-3 | 0.975 | OK | 19.98 |
| 14 | A-4 | 1.625 | B-4 | 0.975 | OK | 19.98 |
| 15 | A-4 | 1.625 | B-5 | 0.975 | OK | 20.05 |
| 16 | A-4 | 1.625 | B-6 | 0.975 | OK | 20.03 |
| 17 | A-4 | 1.625 | B-8 | 0.975 | OK | 20.02 |

EL test results column of table 4, NG represented poor test result.

Table 4 showed that EL test results of paste using single lead-free tellurium glass (No. 1-4) were all NG.

B-1 (Disclosed in patent 7, lead and bismuth glass containing substantially no tellurium, of which lead and bismuth were essential components), combined with any type of lead-free tellurium glass from A-1 to A-4 (No. 5-8), the results of EL inspection were not satisfactory.

The EL test results of combination B-2 (lead-boron-silicate glass disclosed in patent 8) and A-5 (tellurium-glass disclosed in patent 8) was also NG (No. 9).

It proved that lead-silicate-glass combines with any tellurium glass, did not always provide satisfactory EL inspection results.

A combination (No. 13) of B3 (lead-silicate glass of this invention) and A-4 (tellurium-bismuth-lithium and lead-free glass) showed good EL inspection result.

But B-3 combinates with A-1 to A-3 (other tellurium glasses), the EL inspection results were all poor (No. 10-12).

A-4 combined with B-3 to B-6, and B-8, EL inspection results were all good (No. 13-17).

From B series example, representing lead and silicate glass, it is confirmed that silicon and lead were indispensable. The removal of any element of zinc, tungsten, sodium, or lithium was able to obtain good results of EL detection.

Since B-7 could not form glass, no combination experiment was conducted.

In FIG. 5, Paste (No. 1-4) were the results of using lead-free tellurium glass alone.

A-1 was sample 7 on page 9 of patent 7.

A-2 and A-3 were samples No. 1 and No. 7 on page 10 of patent 4.

A-4 was a lead-free tellurium glass of this invention.

According to the above results, all cells using lead-free tellurium glass alone showed black spots (EL bad) at EL inspection.

Paste (No. 5-8) consists of the above lead-free tellurium glass from A-1 to A-4 and lead glass (B-1) showed in table 2 (patent 7, p. 12, B6 in table 2). All combinations were also found to have black spots on EL inspection (EL bad).

It was confirmed that combination mentioned in patent 7, tellurium glass consisted of tellurium, tungsten, and bismuth as essential components, substantially no lead, and lead glass comprising lead and bismuth as essential components, substantially no tellurium, had no good effect on EL inspection.

Paste No. 9 was prepared with the same glass of paste No. 1, showed on page 13 of patent 8. The glass recipe was shown in table 1-3 and table 2-2 and is of same composition as lead-boron-silicate glass (glass A) on page 12 of patent 8 and tellurium glass (glass B) on page 13. It was confirmed that EL inspection had black spots (EL bad).

According to the above results, it was confirmed that inorganic reaction system proposed in patent 8 had no effect on EL improvement, which was fundamentally different from this invention.

Paste No. 10-13 were to verify the results of compound combination with lead-silicate-glass invented by inventor himself. Only No. 13 EL results showed improvement. Therefore, it was confirmed that lithium was an essential component for similar lead-free tellurium bismuth glass, and only in the presence of lithium, it could be used in combination with lead silicate glass to achieve good results.

By comparing paste No. 8 and 13, it was found that the difference in effect was caused by difference between glass B-1 and B-3. Therefore, paste No. 14-17 were for the purpose of finding essential elements of glass B-3.

Verification method was to remove one of oxides from B-4 to B-8. The results showed that lead and silicon were essential elements, including ability of glass formation.

The following table 5, table 6 and table 7 showed the range of the combination of lead-free tellurium glass and lead silicate glass in the invention.

TABLE 5

| | mol % | | | | | | | | |
|---|---|---|---|---|---|---|---|---|---|
| | TeO2 | Bi2O3 | WO3 | ZnO | SiO2 | Li2O | Na2O | Al2O3 | CuO | glass status |
| A-6 | 75.9 | 9.6 | 2.1 | 2.6 | 4.3 | 3.4 | 2.2 | | | good |
| A-7 | 66.2 | 10.7 | 1.2 | 3.0 | 2.8 | 12.0 | 4.2 | | | good |
| A-8 | 57.6 | 6.9 | 3.5 | 2.9 | 11.3 | 13.9 | 4.0 | | | good |
| A-9 | 96.8 | | | | | 3.2 | | | | good |
| A-10 | 83.8 | 14.4 | | | | 1.9 | | | | good |
| A-11 | 30.7 | 59.7 | | | | 9.6 | | | | Not melted |
| A-12 | 19.7 | 76.6 | | | | 3.7 | | | | Not uniform melting |
| A-13 | 37.8 | 55.2 | | | | 7.1 | | | | Not uniform melting |
| A-14 | 43.9 | 51.2 | | | | 4.9 | | | | good |
| A-15 | 75.3 | 17.7 | 2.7 | | | 2.9 | 1.2 | 0.1 | 0.1 | good |

It was confirmed from A-11, A-12 and A-13 in table 5, that glass could not be formed or uniformly melted when tellurium oxide content of lead-free glass was less than 40 mol % and bismuth oxide was more than 55 mol %.

TABLE 6

| | mol % | | | | | | | | |
|---|---|---|---|---|---|---|---|---|---|
| | PbO | Bi2O3 | ZnO | WO3 | SiO2 | Na2O | Li2O | Al2O3 | CuO | glass status |
| B-9 | 38.9 | 5.3 | 2.2 | 2.7 | 37.2 | 3.1 | 10.7 | | | good |
| B-10 | 57.1 | | | | 42.9 | | | | | good |
| B-11 | 20 | | | | 80 | | | | | Not melted |
| B-12 | 80 | | | | 20 | | | | | good |
| B-13 | 70 | | | | 20 | | 10 | | | good |
| B-14 | 20 | | | | 70 | | 10 | | | Not melted |
| B-15 | 70 | | | | 30 | | | | | good |
| B-16 | 30 | | | | 70 | | | | | Not melted |
| B-17 | 53.8 | 19.6 | 4.71 | 4.17 | 14.0 | 0.76 | 1.85 | 0.9 | 0.17 | good |

It was confirmed from B-10, B-12, and B-15 in table 6, even if only two elements, lead and silicon were contained, it was still able to form glass well.

It was also confirmed from B-11, B-14 and B-16 in table 6, when lead oxide content of lead-silicate-glass was less than or equal to 30%, and content of silicon oxide was greater than or equal to 70%, it was not able to form glass.

TABLE 7

| Paste No. | Lead-free, Tellurium glass | wt % | Lead-Silicate glass | wt % | EL inspection | cell efficiency(%) | bonding strength (N) |
|---|---|---|---|---|---|---|---|
| 18 | A-4 | 1.625 | B-12 | 0.975 | NG | 9.67 | N.A |
| 19 | A-4 | 1.625 | B-13 | 0.975 | OK | 19.45 | N.A |
| 20 | A-6 | 1.625 | B-3 | 0.975 | OK | 20.00 | N.A |
| 21 | A-7 | 1.625 | B-3 | 0.975 | OK | 19.98 | N.A |
| 22 | A-8 | 1.625 | B-3 | 0.975 | OK | 20.03 | N.A |
| 23 | A-9 | 1.625 | B-3 | 0.975 | NG | 2.58 | N.A |
| 24 | A-10 | 1.625 | B-3 | 0.975 | NG | 7.20 | N.A |
| 25 | A-4 | 0.813 | B-3 | 0.488 | OK | 20.05 | 2.0 |
| | A-6 | 0.813 | B-9 | 0.488 | | | |
| 26 | A-4 | 1.40 | B-3 | 1.2 | OK | 20.10 | 1.9 |
| 27 | A-4 | 1.20 | B-3 | 1.4 | OK | 20.15 | 1.8 |
| 28 | A-4 | 1.00 | B-3 | 1.2 | OK | 20.30 | 1.9 |
| 29 | A-4 | 0.80 | B-3 | 1.4 | OK | 20.21 | 1.9 |
| 30 | A-4 | 1.80 | B-3 | 0.8 | OK | 20.15 | 1.7 |
| 31 | A-15 | 0.70 | B-17 | 1.1 | OK | 20.59 | 1.5 |
| 32 | A-15 | 0.63 | B-17 | 0.98 | OK | 20.62 | 1.4 |
| 33 | A-15 | 0.63 | B-17 | 1.22 | OK | 20.69 | 1.5 |
| 34 | A-15 | 0.78 | B-17 | 1.22 | OK | 20.27 | 1.5 |
| 35 | A-15 | 1.00 | B-17 | 1.00 | OK | 20.12 | 1.5 |
| 36 | A-15 | 1.20 | B-17 | 0.8 | OK | 19.57 | 1.4 |
| 37 | A-15 | 0.50 | B-17 | 1.5 | OK | 20.26 | 1.6 |
| 38 | A-14 | 1.4 | B-3 | 1.2 | OK | 19.50 | 1.9 |

It was confirmed from No. 18 sample (A-4+B-12) in table 7, when lead oxide content of lead-silicate-glass (B-12) was more than 80 mol %, EL result was not good.

It is confirmed from No. 23 sample (A-9+B-3) of table 8, when bismuth oxide was removed from lead-free tellurium glass (A-9), EL test result was not good.

It was confirmed from No. 24 sample (A-10+B-3) of table 8, the amount of tellurium oxide present in lead-free tellurium glass was more than 80 mol % and content of lithium oxide was less than 2 mol %, EL test result was not good.

Figure 6:
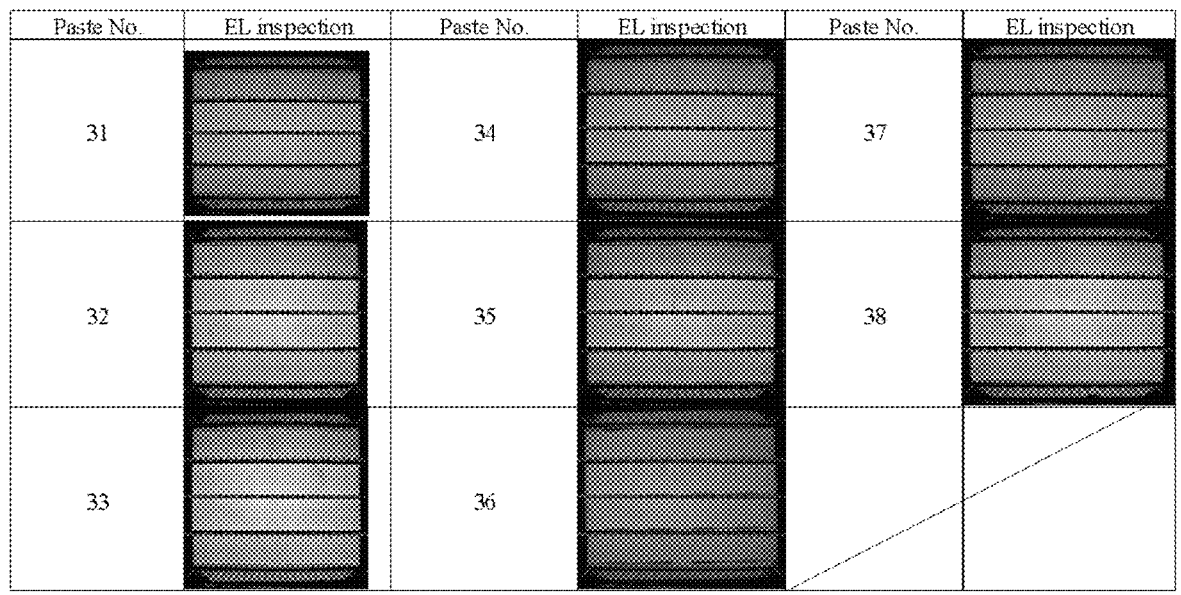
FIG. 6 are EL test pictures of the samples number 31-38.

FIG. 6 showed EL inspection photos of No. 31-38 sample of table 7. As FIG. 6 showed, there were no black spots in each photo, it proved that EL test results of No. 31-38 were good.

Paste No. 31-37 of table 7 were combination of A-15 and B-17, but content and relative ratio of which were different, which proved that these contents and ratios produced better reliability solar cells.

Among them, paste No. 31 was the result of monocrystalline silicon solar cell with a passivation layer under anti-reflection film silicon series semiconductor substrate.

The rest pastes were the results of a monocrystalline silicon series semiconductor substrate with antireflection film.

This proved that paste of this invention is suitable for both a passivated semiconductor substrate and not passivated semiconductor substrate.

According to the above results, it is confirmed that conductive pastes provided by this invention is able to cover wide range of application.

INDUSTRIAL VALUE OF THIS INVENTION

The conductive paste of this invention can be used as an electrode paste to obtain good electrical properties (solar cell conversion efficiency) and bonding strength, while EL inspection shows good contact that ends up better reliability.

Under the instruction of this invention and the above embodiments, technical personnel can easily foresee each raw materials or its equivalent substitutes, processing methods or its equivalent substitutes, embodiments are not listed here, can realize this invention, and also process parameter values of upper and lower limits and interval values, embodiments are not all listed here, can realize this invention.

The invention claimed is:

1. A conductive paste for forming an electrode on a surface of a solar cell comprising a conductive powder, a mixed glass and an organic phase, wherein the mixed glass comprises two types of glass components: a first type of glass consisting of tellurium glass which consists of tellurium oxide, bismuth oxide and lithium oxide, wherein the tellurium glass comprises the tellurium oxide of 44-76 mol %, the bismuth oxide of 7-51 mol % and the lithium oxide of 2-14 mol %; and a second type of glass comprising lead silicate glass with lead oxide and silicon oxide and without tellurium, wherein the lead silicate glass comprises the lead oxide of 39-70 mol %, the silicon oxide of 20-43 mol %, and at least one of zinc, tungsten, sodium, lithium, aluminum and copper having a mole percentage being larger than 0 mol % and smaller than or equal to 20 mol %.

2. The conductive paste of claim 1, wherein in the mixed glass, the mass ratio of the total amount of the tellurium glass to the total amount of the lead silicate glass is 2:8 to 8:2.

3. The conductive paste of claim 1, wherein the mixed glass is controlled such that a mass ratio of the mixed glass to the conductive powder is from 0.1:100 to 10:100.

4. A solar cell having a semiconductor substrate, an antireflection film arranged in a first area on a surface of the semiconductor substrate, and a surface electrode arranged in a second area on the surface of the semiconductor substrate, wherein the surface electrode is formed by printing of the conductive paste of claim 1.

5. A method for manufacturing a solar cell, wherein the solar cell has a semiconductor substrate, an antireflection film arranged in a first area on a surface of the semiconductor substrate, and a surface electrode arranged in a second area on the surface of the semiconductor substrate, wherein the manufacturing method is mainly divided into the following three steps:
a first step of forming an antireflection film on the surface of the semiconductor substrate;
a second step of printing a conductive paste containing a conductive powder, a mixed glass and an organic phase on the antireflection film formed in the first step, wherein the mixed glass comprises two types of glass components: a first type of glass consisting of tellurium glass which consists of tellurium oxide, bismuth oxide and lithium oxide, wherein the tellurium glass comprises the tellurium oxide of 44-76 mol %, the bismuth oxide of 7-51 mol % and the lithium oxide of 2-14 mol %, and a second type of glass comprising lead silicate glass with lead oxide and silicon oxide and without tellurium, wherein the lead silicate glass comprises the lead oxide of 39-70 mol %, the silicon oxide of 20-43 mol %, and at least one of zinc, tungsten, sodium, lithium, aluminum and copper having a mole percentage being larger than 0 mol % and smaller than or equal to 20 mol %; and a third step of firing the conductive paste, removing the antireflection film underneath of the conductive paste during the firing process, as to finally form the antireflection film in the first area of the semiconductor substrate, and the surface electrode in the second area of the semiconductor substrate.

6. A glass powder for a solar cell, which is the mixed glass of claim 1.

* * * * *